(12) United States Patent
Ieong et al.

(10) Patent No.: US 7,364,958 B2
(45) Date of Patent: Apr. 29, 2008

(54) CMOS ON HYBRID SUBSTRATE WITH DIFFERENT CRYSTAL ORIENTATIONS USING SILICON-TO-SILICON DIRECT WAFER BONDING

(75) Inventors: Meikei Ieong, Wappingers Falls, NY (US); Alexander Reznicek, Mount Kisco, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 11/327,966

(22) Filed: Jan. 9, 2006

(65) Prior Publication Data
US 2006/0108643 A1   May 25, 2006

Related U.S. Application Data

(62) Division of application No. 10/696,634, filed on Oct. 29, 2003, now Pat. No. 7,023,055.

(51) Int. Cl.
*H01L 21/46* (2006.01)
(52) U.S. Cl. .................. 438/198; 438/199; 438/455; 438/504; 257/E21.6
(58) Field of Classification Search ........... 438/198, 438/498; 257/E21.6
See application file for complete search history.

(56) References Cited

U.S. PATENT DOCUMENTS

| | | | | |
|---|---|---|---|---|
| 4,878,957 | A | * | 11/1989 | Yamaguchi et al. ........ 148/33.3 |
| 5,677,922 | A | | 10/1997 | Hayafuji et al. |
| 6,759,277 | B1 | | 7/2004 | Flores et al. |
| 6,815,278 | B1 | * | 11/2004 | Ieong et al. ................. 438/198 |
| 6,821,826 | B1 | * | 11/2004 | Chan et al. ................. 438/150 |
| 7,138,683 | B2 | * | 11/2006 | Guarini et al. .............. 257/347 |
| 7,291,542 | B2 | * | 11/2007 | Iwamatsu et al. ........... 438/455 |
| 2001/0030354 | A1 | * | 10/2001 | Shimizu et al. ............. 257/627 |
| 2003/0094674 | A1 | * | 5/2003 | Ipposhi et al. .............. 257/627 |
| 2004/0087109 | A1 | * | 5/2004 | McCann et al. ............ 438/455 |
| 2004/0256700 | A1 | * | 12/2004 | Doris et al. ................. 257/627 |
| 2004/0266128 | A1 | * | 12/2004 | Chen et al. ................. 438/403 |
| 2005/0082531 | A1 | | 4/2005 | Rim |

FOREIGN PATENT DOCUMENTS

JP         2001068708        3/2001

* cited by examiner

*Primary Examiner*—Stephen W. Smoot
(74) *Attorney, Agent, or Firm*—Scully, Scott, Murphy & Presser, P.C.; Ido Tuchman, Esq.

(57) ABSTRACT

A method in which semiconductor-to-semiconductor direct wafer bonding is employed to provide a hybrid substrate having semiconductor layers of different crystallographic orientations that are separated by a conductive interface is provided. Also provided are the hybrid substrate produced by the method as well as using the direct bonding method to provide an integrated semiconductor structure in which various CMOS devices are built upon a surface orientation that enhances device performance.

37 Claims, 17 Drawing Sheets

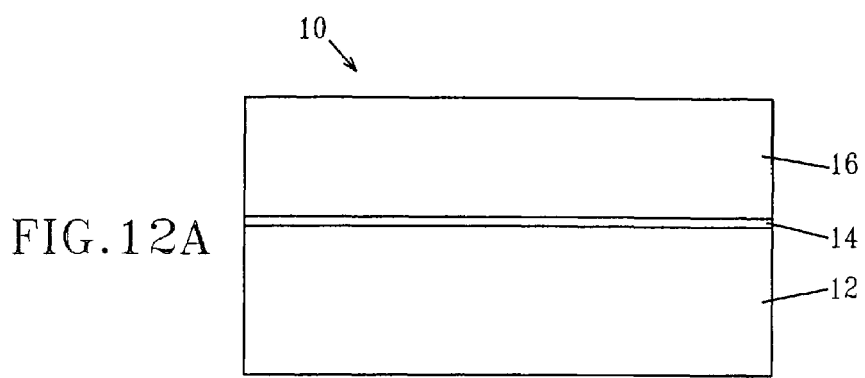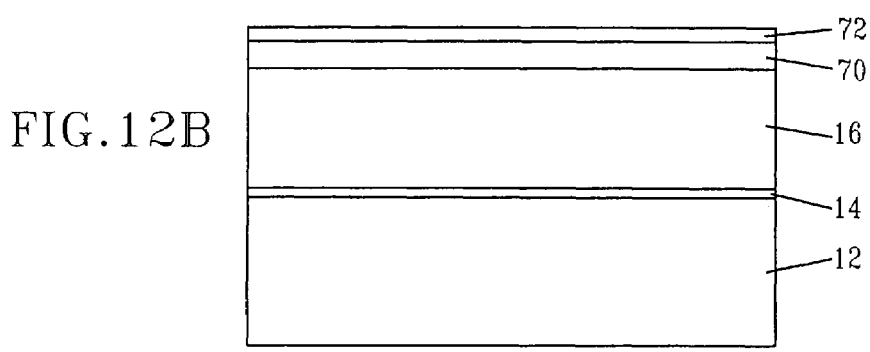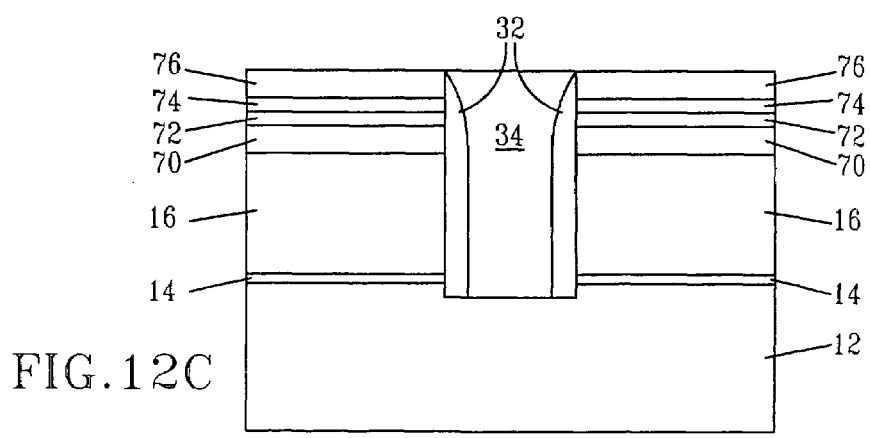

CMOS ON HYBRID SUBSTRATE WITH DIFFERENT CRYSTAL ORIENTATIONS USING SILICON-TO-SILICON DIRECT WAFER BONDING

RELATED APPLICATION

This application is a divisional of U.S. application Ser. No. 10/696,634 filed Oct. 29, 2003, now U.S. Pat. No. 7,023,055 which is related to and co-assigned U.S. patent application Ser. No. 10/250,241, filed Jun. 17, 2003, the entire content of which is incorporated herein by reference.

FIELD OF THE INVENTION

The present invention relates to high-performance metal oxide semiconductor field effect transistors (MOSFETs) for digital or analog applications, and more particularly to MOSFETs utilizing carrier mobility enhancement from surface orientation.

BACKGROUND OF THE INVENTION

In present semiconductor technology, CMOS devices, such as nFETs or pFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above discussion, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Methods have been described to form planar hybrid substrates with different surface orientations through wafer bonding. In such endeavors, the planar hybrid substrate is obtained mainly through semiconductor-to-insulator, or insulator-to-insulator wafer bonding to achieve pFETs and nFETs on their own optimized crystal orientation for high performance device manufacture. However, at least one type of MOSFET (either pFETs or nFETs) is on a semiconductor-on-insulator (SOI), while the other type of MOSFET is either on a bulk semiconductor or an SOI with a thicker SOI film.

Other technology exists wherein both nFETs and pFETs are fabricated on SOI with the same thickness, but with additional processing steps. SOI devices generally have higher performance than bulk-like devices due to less parasitic capacitance; however, SOI devices have a floating body (i.e., well), whose effect is known to depend on the SOI thickness. Generally, each SOI device is isolated from the other by a shallow trench isolation (STI) region and the buried oxide (BOX). This prior art structure is shown, for example, in FIG. 1. To avoid the floating body effect, each SOI device needs it's own body contact. Such a structure would significantly increase the area of the chip.

On the other hand, the body of MOSFETs fabricated on a bulk silicon substrate is connected through well contacts, which usually are deeper than the STI. Although bulk-devices are isolated from each other by STI, their body contacts can be connected to each other through a common well contact; See, for example, FIG. 2.

In view of the above discussion, there is a need for providing a structure having both pFETs and nFETs on a hybrid substrate with different crystal orientations, wherein the pFET and nFET devices are all bulk-like devices, and wherein each device has a body contact through the well or substrate.

SUMMARY OF THE INVENTION

One object of the present invention is to provide a method of integrating semiconductor devices such that different types of devices are formed upon a specific crystal orientation of a hybrid substrate that enhances the performance of each type of device.

Another object of the present invention is to provide a method of integrating semiconductor devices such that the pFETs are located on a (110) crystallographic plane, while the nFETs are located on a (100) crystallographic plane of a hybrid substrate.

A further object of the present invention is to provide a method of integrating semiconductor devices on a hybrid substrate having different crystal orientations such that each device is a bulk-like device and is located on a crystal orientation which enhances the performance of the device.

An even further object of the present invention is to provide a method of integrating semiconductor devices on a hybrid substrate having different crystal orientations such that each device has its own body contact through a well or the substrate.

An additional object of the present invention is to provide a method of integrating different CMOS devices onto a hybrid substrate having different crystallographic surface planes wherein isolation regions are formed between the different types of CMOS devices.

These and other objects and advantages are achieved in the present invention by utilizing a method in which semiconductor-to-semiconductor, especially Si-to-Si, direct wafer bonding is employed as one of the processing steps. In accordance with the present invention, two semiconductor wafers or substrates having different crystal orientations are subjected to a direct wafer bonding process. Following the direct wafer bonding, the hybrid substrate thus obtained is subjected to patterning, etching, regrowth of a semiconductor layer, isolation formation and semiconductor device formation.

One aspect of the present invention relates to a hybrid substrate that comprises:

a first semiconductor layer having a first crystallographic orientation; and a second semiconductor layer having a second crystallographic orientation which is different from the first crystallographic orientation, wherein said first and second semiconductor layers are separated from each other by a conductive interface.

Another aspect of the present invention is directed to a method of fabricating the aforementioned hybrid substrate. Specifically, the hybrid substrate is fabricated using a method that comprises:

providing a first semiconductor wafer comprising a first semiconductor material having a first crystallographic orientation and a second semiconductor wafer comprising a second semiconductor material having a second crystallographic orientation which is different from the first crystallographic orientation; and bonding the first semiconductor wafer to the second semiconductor wafer, wherein a conductive interface forms between the two wafers.

A further aspect of the present invention relates to an integrated semiconductor structure that includes:

a hybrid structure comprising a first device region having a first crystallographic orientation and a second device region having a second crystallographic orientation, said first crystallographic orientation is different from said second crystallographic orientation;

an isolation region separating said first device region from said second device region; and at least one first semiconductor device located in said first device region and at least one second semiconductor device located in said second device region, wherein said first semiconductor device and said second semiconductor device are both bulk-like devices and both devices contain a well region that serves as a body contact.

Another aspect of the present invention relates to a method of forming the integrated semiconductor structure which includes the steps of:

providing a hybrid substrate comprising at least a first semiconductor layer of a first crystallographic orientation and a second semiconductor layer of a second crystallographic orientation separated by a conductive interface, said first crystallographic orientation is different from said second crystallographic orientation and said first semiconductor layer lies below said second semiconductor layer;

selectively etching a portion of the hybrid substrate to expose a surface of the first semiconductor layer;

regrowing a semiconductor material on said exposed surface of the first semiconductor layer, said semiconductor material having a crystallographic orientation that is the same as the first crystallographic orientation;

providing well regions in said second semiconductor layer and said regrown semiconductor material; and forming at least one first semiconductor device on said regrown semiconductor material, while forming at least one second semiconductor device on said second semiconductor layer.

BRIEF DESCRIPTION OF THE DRAWINGS

FIGS. 12A-12D are pictorial representations (through cross sectional views) showing one approach for providing a strained Si MOSFET of the present invention.

DETAILED DESCRIPTION OF THE INVENTION

Figure 1:
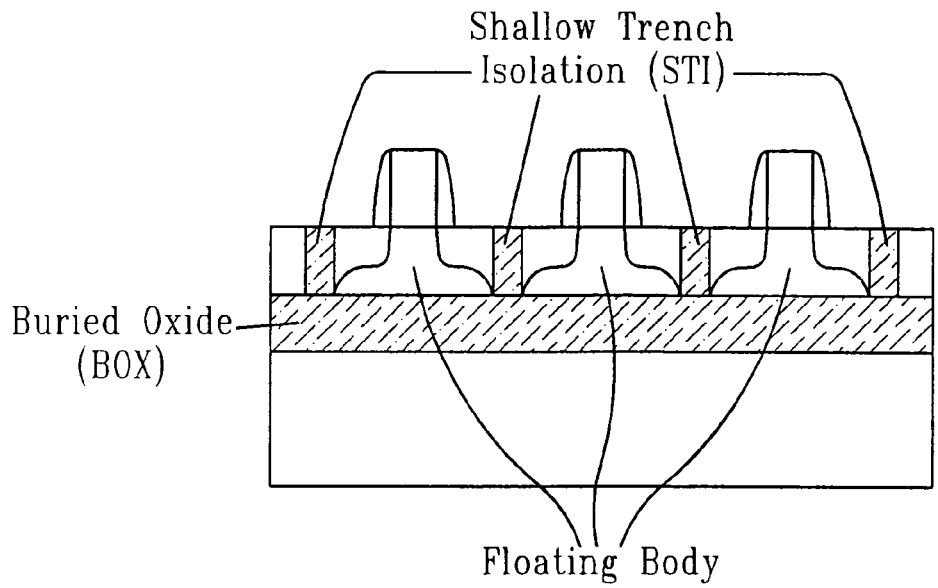
FIG. 1 is a pictorial representation (through a cross sectional view) illustrating a prior art structure including MOSFETs on an SOI substrate in which a floating body exists.
Figure 2:
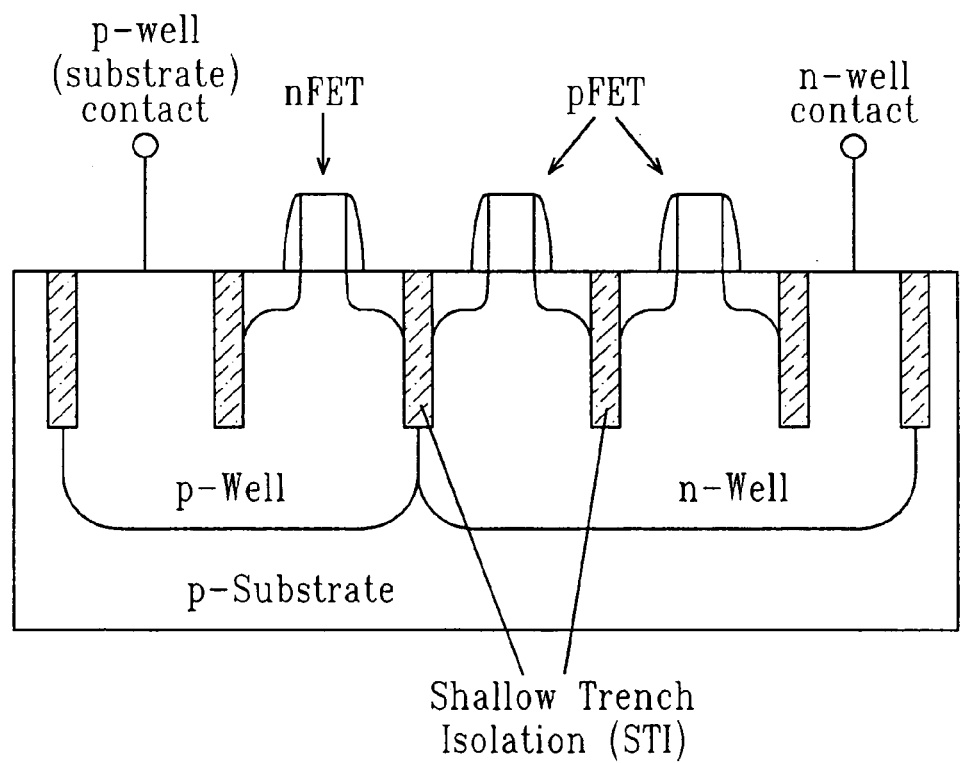
FIG. 2 is a pictorial representation (through a cross sectional view) illustrating a prior art structure including MOSFETs on a bulk substrate in which well contacts are present.

The present invention, which provides a method of forming CMOS devices on a hybrid substrate having different crystal orientations using semiconductor-to-semiconductor direct bonding, will now be described in more detail by referring to the drawings that accompany the present application.

Figure 3:
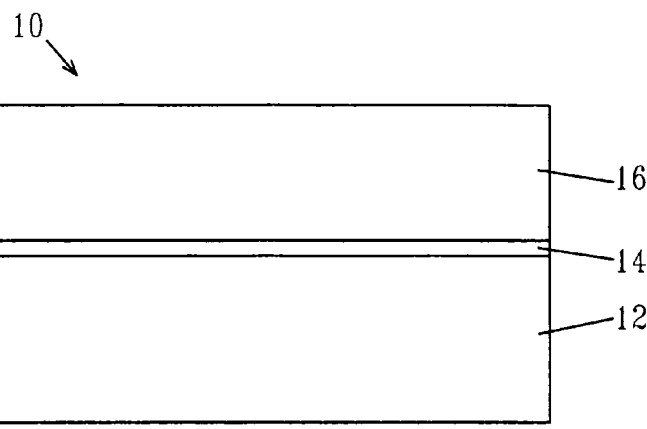
FIG. 3 is a pictorial representation (through a cross sectional view) showing a hybrid substrate of the present invention having different surface orientations which is obtained by semiconductor-to-semiconductor direct bonding.

FIG. 3 shows an initial hybrid substrate 10 having different crystallographic orientations that can be employed in the present invention. Specifically, the hybrid substrate 10 includes a first (bottom) semiconductor layer 12 and a second (top) semiconductor layer 16 having a bonding interface 14 located therebetween. In accordance with the present invention, the first semiconductor layer 12 comprises a first semiconductor material that has a first crystallographic orientation and the second semiconductor layer 16 comprises a second semiconductor material that has a second crystallographic orientation which differs from the first crystallographic orientation.

The first semiconductor layer 12 of hybrid substrate 10 is comprised of any semiconductor material including, for example, Si, SiC, SiGe, SiGeC, Ge, GaAs, InAs, InP as well as other III/V or II/VI compound semiconductors. Combinations of the aforementioned semiconductor materials are also contemplated herein. First semiconductor layer 12 may be strained, unstrained, or a combination of strained and unstrained layers can be used. The first semiconductor layer 12 is also characterized as having a first crystallographic orientation which may be (110), (111), or (100). The first semiconductor layer 12 may optionally be formed on top of a handling wafer.

In embodiments in which the first semiconductor layer 12 is a bulk handle wafer, its thickness is the thickness of a wafer.

The second semiconductor layer 16 is comprised of any semiconducting material which may be the same or different from that of the first semiconductor layer 12. Thus, the second semiconductor layer 16 may include, for example, Si, SiC, SiGe, SiGeC, Ge, GaAs, InAs, InP as well as other III/V or II/VI compound semiconductors. The second semiconductor layer 16 may also include combinations of the aforementioned semiconductor materials. Second semiconductor layer 16 may also be strained, unstrained or a combination of strained and unstrained layers can be used, e.g., strained Si on relaxed SiGe.

The second semiconductor layer 16 is also characterized as having a second crystallographic orientation, which is different from the first crystallographic orientation. Thus, the crystallographic orientation of the second semiconductor layer 16 is (100), (111), or (110) with the proviso that the crystallographic orientation of the second semiconductor layer 16 is not the same as the crystallographic orientation of the first semiconductor layer 12.

The thickness of the second semiconductor layer 16 may vary depending on the initial starting wafer used to form the hybrid substrate 10. Typically, however, the second semiconductor layer 16 has a thickness from about 50 nm to about 200 μm, with a thickness from about 150 nm to about 2 μm being more highly preferred.

The bonding interface 14 that is present between the first semiconductor layer 12 and the second semiconductor layer 16 is a conductive interface. The interface 14 typically has a thickness from about 10 nm or less. The thickness of the interface 14 is determined by the bonding process used and whether the surfaces are treated with a hydrophilic or hydrophobic agent prior to bonding.

The exact crystal orientations of the first semiconductor layer 12 and the second semiconductor layer 16 may vary depending on the material of the semiconductor layer as well as the type of semiconductor device that will be subsequently formed thereon. For example, when Si is employed as the semiconductor material, electron mobility is higher on a (100) surface orientation, and hole mobility is higher on a (110) surface orientation. In this case, the (100) Si surface is used as the device layer for nFETs, while the (110) Si surface is used as the device layer for pFETs.

To achieve bulk-like devices on different surface orientations using the hybrid substrate 10 shown, for example in FIG. 3, the interface 14 between the first and second semiconductor layers 12, and 16, respectively, is preferred to have good electrical conductivity. To maintain high crystal quality of the second semiconductor layer 16, the defects/charges should be localized near the interface 14 and not migrate into the second semiconductor layer 16 (especially near the surface) during the formation of the hybrid substrate 10 and the subsequent processes.

The hybrid substrate 10 shown in FIG. 3 is formed in the present invention through semiconductor-to-semiconductor direct bonding. In such a process, two semiconductor substrates or wafers are directly bonded together without the presence of an insulating layer therebetween.

Silicon wafer bonding to obtain insulating layers between wafers to achieve semiconductor-on-insulator structure have been widely known and is described, for example, by J. B. Lasky, "Wafer bonding for silicon-on-insulator technologies", Appl. Phys. Lett., V 48, p 78 (1986); and J. B. Lasky, "Silicon-On-Insulator (SOI) by bonding and etch-back", IEDM Tech. Dig, p 684, 1985.

Figure 4A:
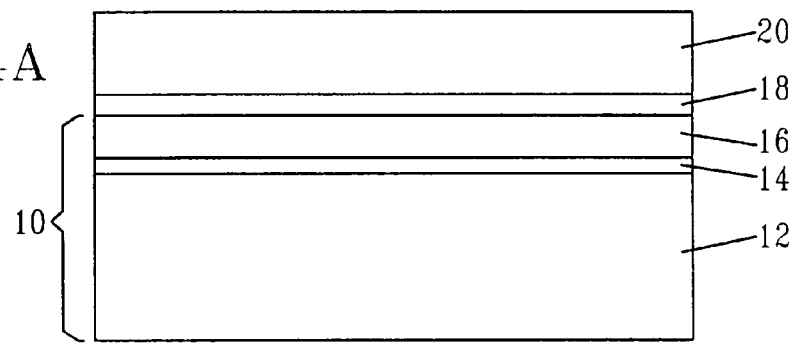
FIGS. 4A-4B are pictorial representations (through cross sectional views) showing various approaches for layer transfer to achieve a thin top semiconductor layer of the hybrid substrate shown in FIG. 3.

The semiconductor-to-semiconductor direct bonding step that is used in the present invention to obtain a conductive interface 14 between the two semiconductor wafers will be described in detail below. The two wafers used in fabricating the hybrid substrate 10 may include two bulk semiconductor wafers; a bulk semiconductor wafer and a wafer containing an etch stop layer 18 and a handling wafer 20 (See FIG. 4A), or a first bulk wafer and a second bulk wafer which includes an ion implant region 22, such as a hydrogen implant (i.e., $H_2$) region, which can be used to split a portion of at least one of the wafers during bonding (See FIG. 4B).

In some embodiments of the present invention the bonding process described in U.S. Ser. No. 10/250,241, the entire content of which is incorporated herein by reference, can be employed.

To achieve a good conductive interface 14 through semiconductor-to-semiconductor direct wafer bonding, it is usually, but not always, required to perform a surface treatment step on at least one, preferably both, of the wafers, before bonding to obtain either hydrophilic or hydrophobic surfaces.

Hydrophobic surfaces can be achieved, for example, by utilizing a HF dip process such as disclosed in S. Bengtsson, et al., "Interface charge control of directly bonded silicon structures", J. Appl. Phys. V 66, p 1231, (1989), while hydrophilic surfaces can be achieved by either a dry clean process, such as, for example, an oxygen plasma (See, S. Farrens, "Chemical free room temperature wafer to wafer bonding", J.Electrochem. Soc. Vol 142, p 3949, (1995)); an argon high-energy beam surface etching, and/or a wet chemical oxidizing acid such as $H_2SO_4$ or $HNO_3$ solution. The wet etching process is disclosed, for example, in M. Shimbo, etc. "Silicon-to-silicon direct bonding method", J. Appl. Phys. V60, p 2987 (1986).

Although hydrophobic surfaces may provide better electronic properties, hydrophilic surfaces may provide sufficient conductivity because the native oxide present at the bonding interface is usually only 2-5 nm. Moreover, substrates formed by the direct bonding of two hydrophilic surfaces tend to have a large leakage current. Furthermore, crystalline junctions can be formed after a high-temperature anneal step is performed to further enhance the current flow across the bonding interface 14.

Direct semiconductor-to-semiconductor wafer bonding (with or without the surface treatments mentioned above) is achieved in the present invention by first bringing the two wafers having different crystal orientations into intimate contact with other; optionally applying an external force to the contacted wafers; and then optionally annealing the two contacted wafers under conditions that are capable of increasing the bonding energy between the two wafers. The annealing step may be performed in the presence or absence of an external force. Bonding is achieved typically during the initial contact step at nominal room temperature. By nominal room temperature, it is meant a temperature from about 15° C. to about 40° C., with a temperature of about 25° C. being more preferred.

After bonding, the wafers are typically annealed to enhance the bonding strength and improve the interface property. The annealing temperature is typically carried out at a temperature from about 900° to about 1300° C., with annealing temperature from about 1000° to about 1100° C. being more typical. Annealing is performed within the aforementioned temperature ranges for various time periods that may range from about 1 hour to about 24 hours. The annealing ambient can be $O_2$, $N_2$, Ar, or a low vacuum, with or without external adhesive forces. Mixtures of the aforementioned annealing ambients, with or without an inert gas, are also contemplated herein.

Although high-temperature annealing (as described above) is often used, it is also possible to use a low temperature anneal (less than 900° C.) which can also achieve good mechanical and electrical properties.

It should be noted that the annealing step that follows the direct semiconductor-to-semiconductor bonding step can be performed at a single temperature using a specific ramp-up rate, or it can be performed using various temperatures in which various ramp-up rates and soak cycles are employed.

To obtain a certain predetermined thickness of the second semiconductor layer 16, various layer transfer techniques can be used in the present invention. One direct and simple approach that can be used in the present invention is to use wafer grinding, polishing or an etch back process. To provide better control of the layer transfer process, an etch stop layer 18 located between second semiconductor layer 16 and a handling wafer 20 can be used (See FIG. 4A); the etch stop layer and the handling wafer are both removed after wafer bonding. The etch stop layer 18 can be an insulator, such as an oxide, nitride or oxynitride, which means the starting top wafer may be an SOI substrate. Alternatively, the etch stop layer 18 can be another semiconductor material which can be removed selectively from the second semiconductor layer 16 after bonding and also serve as an etch stop to remove the handling wafer 20.

Figure 4B:
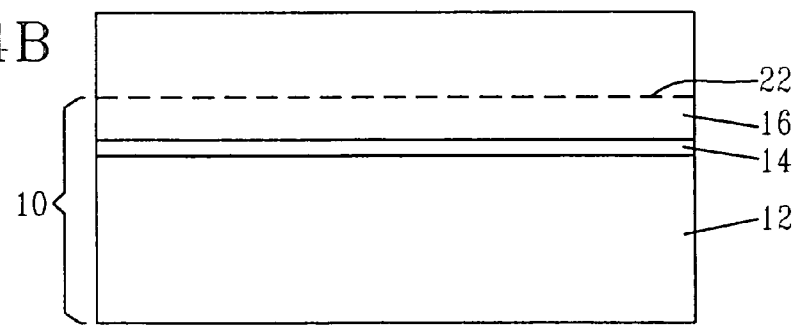

Another layer transfer technique, applicable to embodiments where one of the wafers includes an ion implant region, is illustrated in FIG. 4B. In this case, the ion implant region 22 forms a porous region which causes a portion of the wafer above the ion implant region to break off leaving a bonded wafer such as is shown, for example, in FIG. 4B. The implant region 22 is typically comprised of hydrogen ions that are implanted into the surface of one of the wafers utilizing ion implantation conditions that are well known to those skilled in the art. After bonding, a heating step is typically performed in an inert ambient at a temperature from about 100° to about 400° C. for a time period from about 2 to about 30 hours to increase the bonding energy. More preferably, the heating is performed at a temperature from about 200° to about 300° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$. The layer splitting at the implant region 22 will take place during a 350°-500° C. annealing afterwards.

The hybrid substrate 10 shown in FIG. 3 (which can be formed by a variety of layer transfer techniques) is used as the starting substrate for the method of the present invention that is depicted in FIGS. 5A-5E. The process flow depicted in these drawings will now be described in greater detail.

After providing the hybrid substrate 10 shown in FIG. 3, a hard mask layer, i.e., pad stack, 24 is formed on an exposed upper surface of the second semiconductor layer 16 utilizing a deposition process such as, for example, chemical vapor deposition (CVD), plasma-enhanced chemical vapor deposition (PECVD), chemical solution deposition, atomic layer deposition, or physical vapor deposition. Alternatively, the hard mask layer 24 can be formed utilizing a thermal oxidation, nitridation or oxynitridation process. The resultant structure including the hard mask layer 24 is shown, for example, in FIG. 5A.

The hard mask layer 24 is composed of a dielectric material such as, for example, an oxide, nitride, oxynitride or a stack thereof. The thickness of the hard mask layer 24 may vary depending on the composition of the mask material as well as the technique that was used in forming the same. Typically, the hard mask layer 24 has, an as deposited thickness, from about 5 to about 500 nm.

Figure 5A:
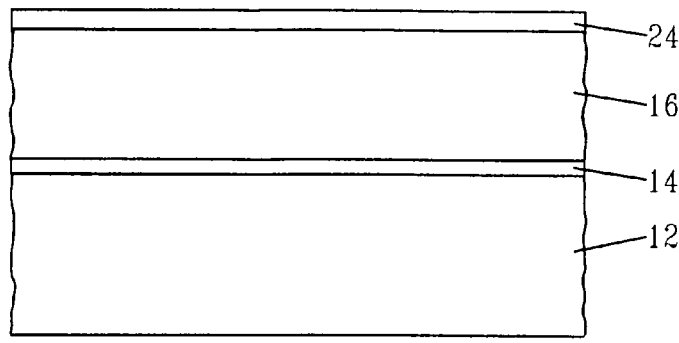
FIGS. 5A-5E are pictorial representations (through cross sectional views) showing the basic processing steps that are employed in the present invention using the hybrid substrate of FIG. 3 as the starting substrate.
Figure 5B:
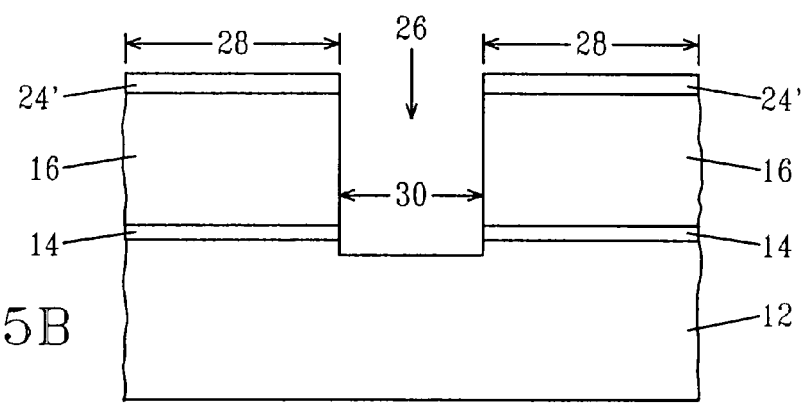

The hard mask layer 24 is then patterned by lithography and etching to provide a patterned mask 24' such as shown, for example, in FIG. 5B. The patterned mask 24' is used as an etch mask to remove an exposed portion of the second semiconductor layer 16 of the hybrid substrate 10, stopping either on an upper surface of the first semiconductor layer 12 or within the first semiconductor layer 12. The resultant structure after pattern transfer is shown, for example, in FIG. 5B. As shown, an opening 26 is provided in the hybrid structure that exposes the underlying first semiconductor layer 12.

The etching of the hard mask layer 24 and pattern transfer may be performed utilizing a single etching process or multiple etching steps may be employed. The etching may include a dry etching process such as reactive-ion etching, ion beam etching, plasma etching or laser etching, a wet etching process wherein a chemical etchant is employed or any combination thereof. In one preferred embodiment of the present invention, reactive-ion etching (RIE) is used in selectively removing the unprotected portions of the second semiconductor layer 16.

The opening 26 is used in defining different active device regions for the subsequent formation of semiconductor devices. Consistent with the terminology used in the present application, the area that will include the second semiconductor layer 16 as the active device layer will be referred to herein as second device region 28, while the area that will include the first semiconductor layer 12 (as an epitaxial regrown layer, to be subsequently described) as the active device layer will be referred to herein as first device region 30.

Figure 5C:
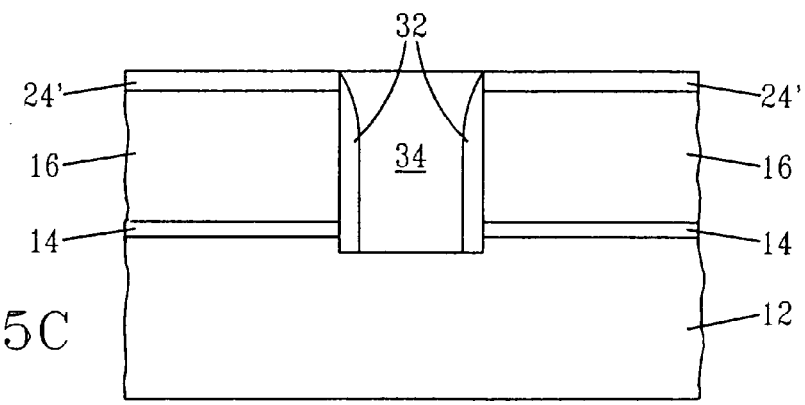

Next, an optional spacer 32 can be formed in the opening 26 on the exposed sidewalls provided by the above processing steps. The optional spacer 32 is formed by deposition and etching. The optional spacer 32 can be comprised of an insulating material such as, for example, an oxide, nitride, oxynitride or any combination thereof. The optional spacer 32 may be a single spacer, as shown, or it may comprise multiple spacers. FIG. 5C shows the presence of optional spacers 32 in the structure.

A semiconductor material 34 is then formed on the exposed surface of the first semiconductor layer 12 to provide the structure shown, for example, in FIG. 5C. In accordance with the present invention, semiconductor material 34 has a crystallographic orientation that is the same as the crystallographic orientation of the first semiconductor layer 12. Although this regrown semiconductor layer will have the same surface orientation as the first semiconductor layer 12, it can be of a different semiconductor material than the first semiconductor layer 12.

The semiconductor material 34 may comprise any semiconductor material, such as Si, strained Si, SiGe, SiC, SiGeC or combinations thereof, which is capable of being formed utilizing a selective epitaxial growth method. Semiconductor material 34 can be strained, unstrained, or it can be comprised of stained and unstrained layers, e.g., strained Si on a relaxed SiGe layer.

In some preferred embodiments, semiconductor material 34 is comprised of Si. In other preferred embodiments, the semiconductor material 34 is a strained Si layer that may or may not be located atop a relaxed SiGe alloy layer. In the present invention, semiconductor material 34 is referred to as a regrown semiconductor material.

To achieve a high quality regrown semiconductor layer 34, selective epitaxy is recommended where there is no polysilicon or amorphous silicon formed on top of the patterned mask 24' outside the openings 26. To eliminate a facet formation during the epitaxy, the semiconductor material 34 can be grown, in some embodiments, higher than the patterned mask 24' and then it is polished down to the patterned mask 24'.

In other embodiments, the regrown semiconductor material 34 may be recessed at this point of the present invention utilizing a time etching process such as a timed RIE. One or more additional semiconductor layers can be formed directly on top of the recessed surface. The semiconductor materials formed would each have the same crystallographic orientation as that of the first semiconductor layer 12.

To achieve a coplanar surface, the semiconductor material 34 may need to be etched back to the same level as the second semiconductor layer 16. This etching can be performed by dry etching, wet etching or oxidation of silicon and then stripping away the oxide.

The patterned mask 24' is now removed from the structure utilizing a conventional stripping process that is capable of selectively removing the patterned mask 24' from the structure. The structure that is formed after the patterned mask 24' has been removed is shown, for example, in FIG. 5D. In this structure, the second semiconductor device surface, i.e., second semiconductor layer 16, is substantially coplanar to the first semiconductor device surface, i.e., the regrown semiconductor material 34.

Figure 5D:
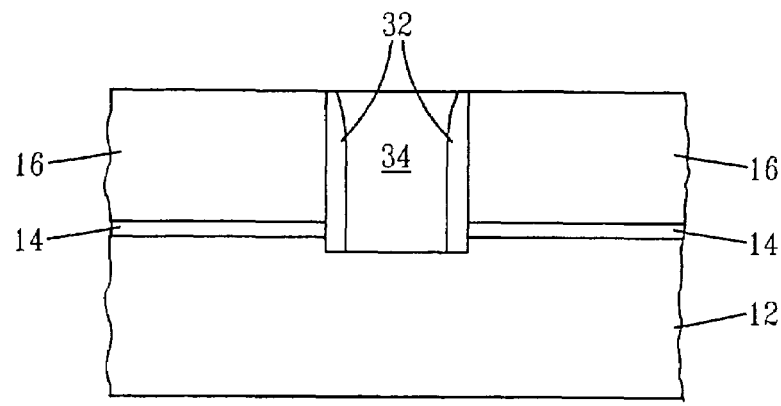

After providing the structure shown in FIG. 5D, standard CMOS processing can be performed, including, for example, device isolation formation, well region formation, and gate region formation. Specifically, after providing the structure shown, in FIG. 5D, isolation regions 36 (See, FIG. 5E), such as shallow trench isolation regions, are typically formed so as to isolate the first semiconductor active device region 30 from the second semiconductor active device region 28.

The isolation regions 36 are formed utilizing processing steps that are well known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric.

Next, well regions are formed into the exposed semiconductor device layers, i.e., layer 16 or regrown semiconductor material 34, by utilizing ion implantation and annealing, both of which are well known to those skilled in the art. The well regions are designated by reference numeral 38 in FIG. 5E. The well regions may be n-type well regions or p-type well regions depending on the type of semiconductor device to be formed on each semiconductor layer, i.e., second semiconductor layer 16 and regrown semiconductor material 34. For example, if the semiconductor device is a pFET, well region 38 will be an n-type well, while if the semiconductor device is an nFET, well region 38 is a p-type well. Doping of each well is performed in different implant steps in which an implant mask is formed atop locations in which the specific dopant is not intended to be implanted into. The well regions 38 serves as body contacts in the present application. The depth of the well regions 38 can vary depending on the implant and annealing conditions as well as the type of dopant used.

After well formation, semiconductor devices, i.e., pFETs and nFETs, are formed on the exposed semiconductor layers, i.e., second semiconductor layer 16 and regrown semiconductor material 34. Specifically, a second semiconductor device 50 is formed on a portion of the second semiconductor layer 16 and a first semiconductor device 52 is formed on the regrown semiconductor material 34. Despite showing the presence of only one semiconductor device in each device region, the present invention contemplates forming a plurality of each type of device in the specific device region. In accordance with the present invention, the first semiconductor device 52 may be a pFET or an nFET, whereas the second semiconductor device 50 may be an nFET or pFET, with the proviso that the first semiconductor device is different from the second semiconductor device and that the specific device is fabricating on a crystal orientation that provides a high performance device.

Figure 5E:
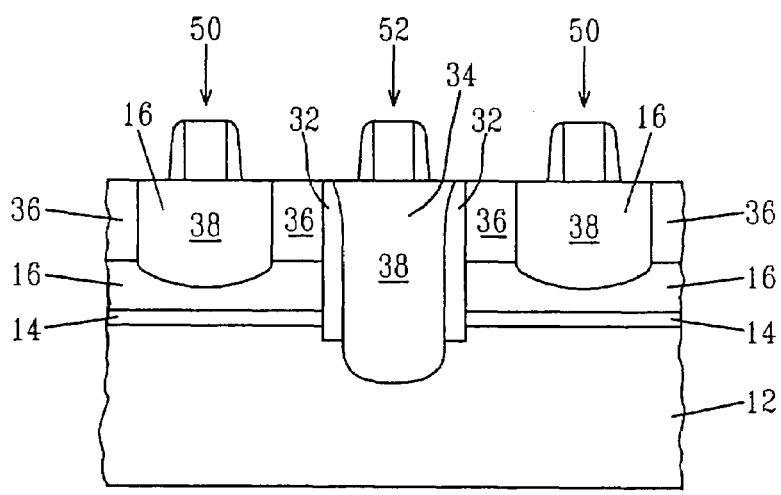

The pFETs and nFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, and source/drain diffusion regions. Note that the pFET is formed over the semiconductor material that has a (110) or (111) orientation, whereas the nFET is formed over a semiconductor surface having a (100) or (111) orientation. The resultant structure including bulk-like FETs is shown in FIG. 5E.

In the present invention, there are several ways to design the bulk-like nFETs and pFETs on the hybrid substrate with different crystal orientations. The main issue here is device and well isolation due to the introduction of the interface 14. In the following examples, pFETs are located on (110) silicon and nFETs are located on (100) silicon with a traditional p-type substrate. The STI depth should be designed to have tradition isolation between nFET-pFET, nFET-nFET and pFET-pFET.

Figure 6:
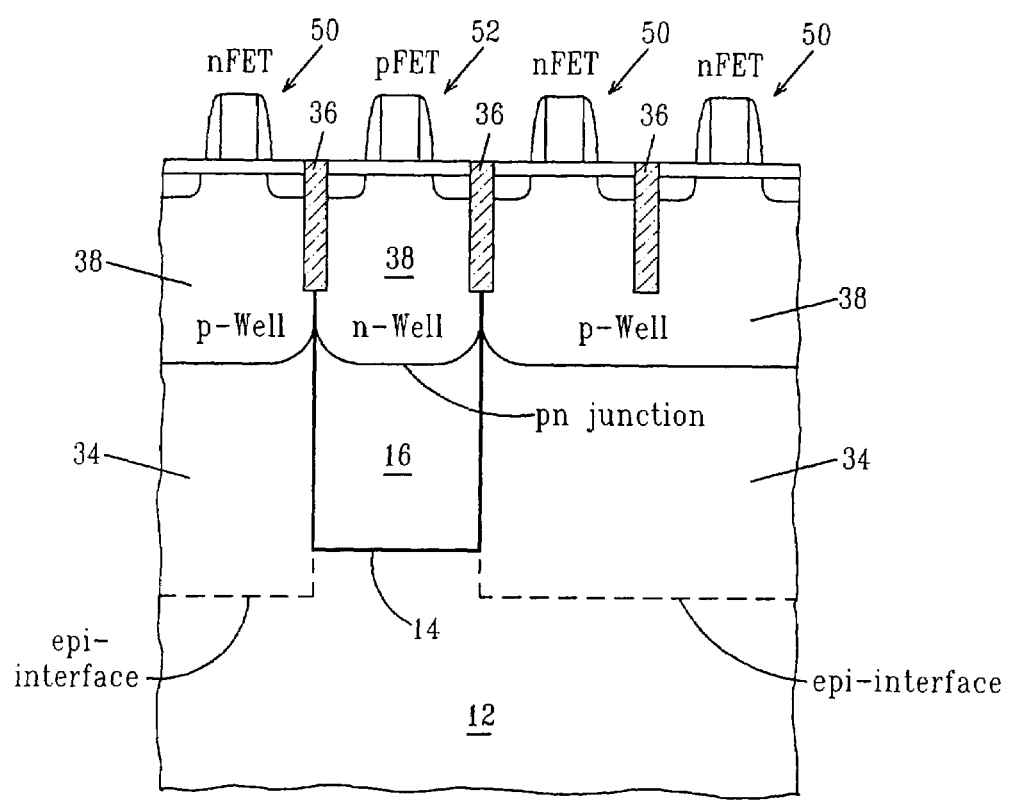
FIGS. 6-11 are pictorial representations (through cross sectional views) showing some bulk CMOS device design strategies on hybrid substrates with different surface orientations that can be utilized in the present invention.
Figure 7:
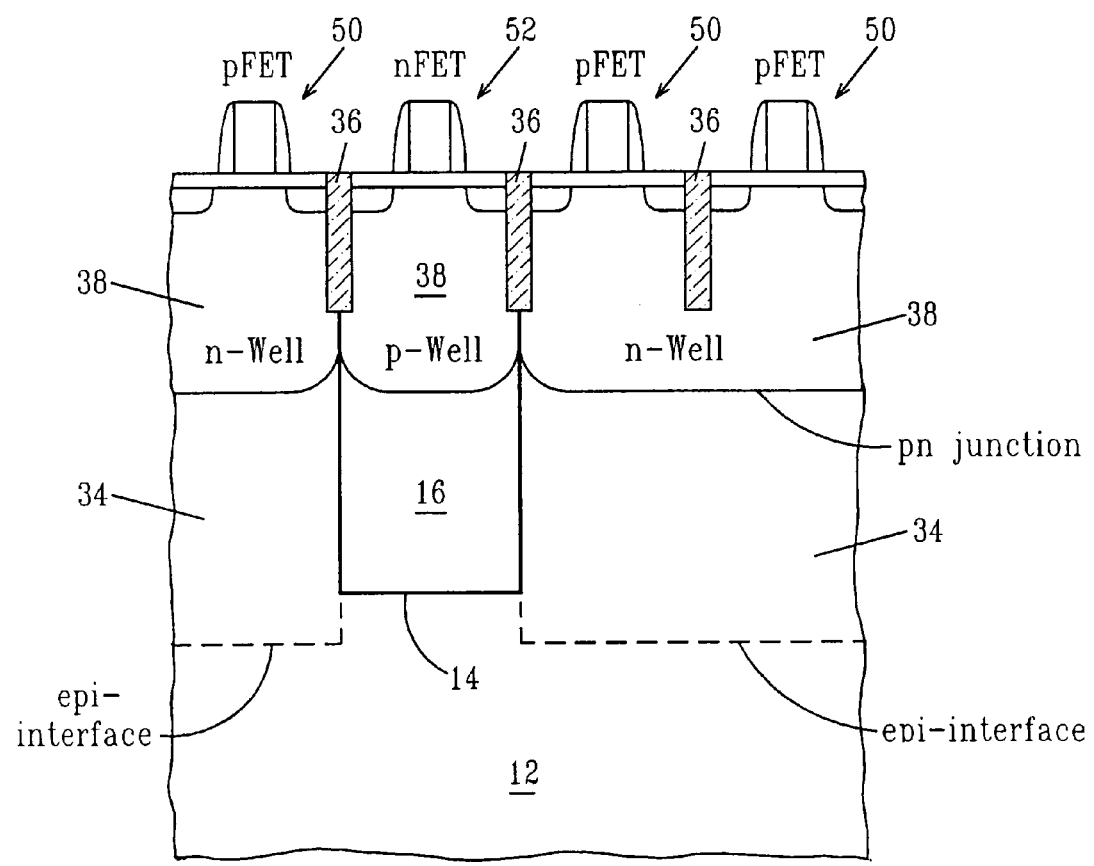

In FIGS. 6-7, there is shown that the conductive (i.e., bonding) interface 14 can be designed to be below the isolation regions 36 and the wells 38. In case of (110) Si 16 on top of (100) Si 12 (as shown in FIG. 6), nFETs in p-well are on the (100) epi-layer 34 and the pFETs in n-well are on (110) Si 16. To avoid well-to-well leakage, the interface 14 should be below the n-well. Specifically, it should be outside the depletion region of the well pn junctions. The depletion width of a pn junction is reverse proportional to their doping level. The p-well to p-well connection is from the epi layer through the first semiconductor and/or across the bonding interface/epitaxy interface. Devices in the same well can share the same well contact (to avoid floating body). In this specific scenario, the conductivity of the bonding interface is not critical, i.e., the bonding interface can be insulator and the bonding can be Si-to-Si, Si-to-oxide or oxide-to-oxide bonding. However, a conducting bonding interface is preferred.

In case of (100) Si 16 on top of (110) Si 12 (as shown in FIG. 7), pFETs in n-well are on (110) epi-layer 34 and nFETs in p-well are on (100) Si 16. To avoid well-to-well leakage, the bonding interface still should be away from the well pn junctions, thus the top Si thickness 16 will be similar to the case in FIG. 6. In this case, p-well to p-well connection will go across the bonding interface and/or the epitaxy interface. Although the conductivity of the bonding interface is not critical, i.e., the bonding interface can be insulator, a good conduction bonding interface is preferred by using Si-to-Si direct bonding as described above.

Figure 8:
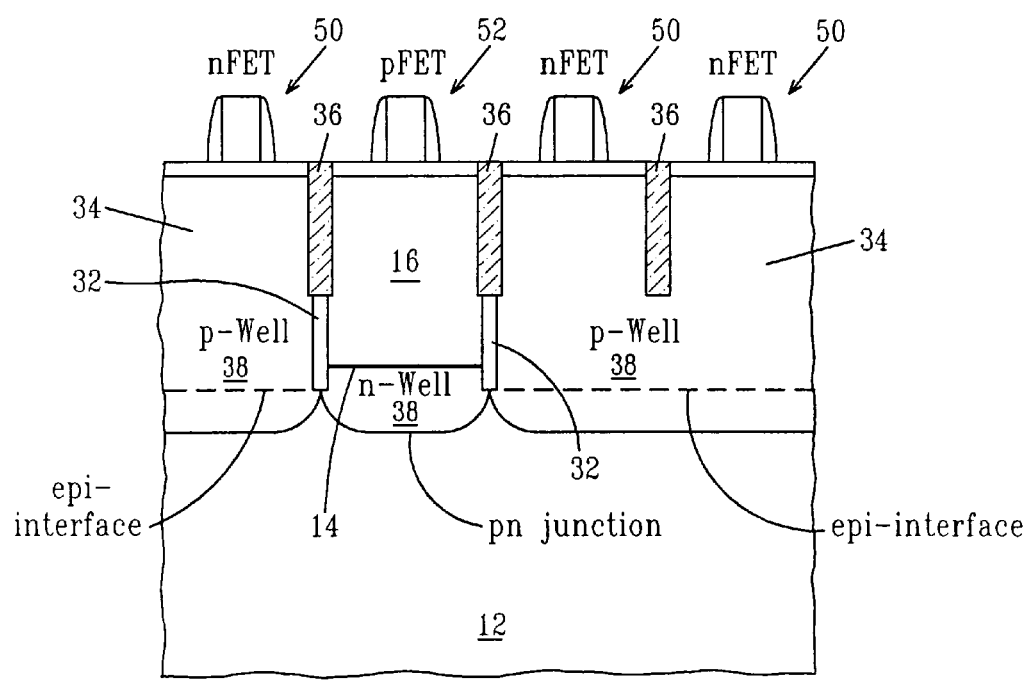
Figure 9:
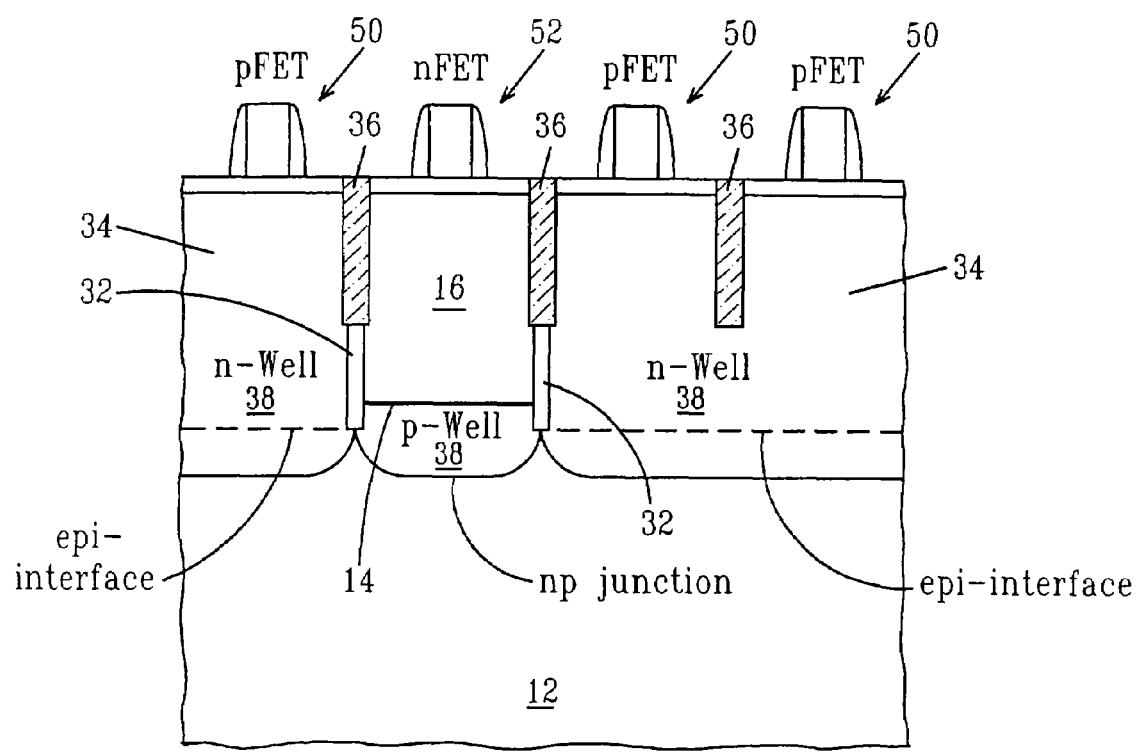

In FIGS. 8-9, there is shown that the bonding interface can be designed inside the well but below isolation region 36 as long as the spacer formed before the epitaxy provides good isolation to the end of the process, where it acts as additional isolation between the wells. In case of (110) Si 16 on top of a (100) handle wafer 12 (as shown in FIG. 8), pFETs in n-well are on (110) Si 16 and nFETs in p-well are on (100) epi-Si 34. The bonding interface can be above the well junctions as long as it is far enough from the well pn junction depletion region. The spacer (and the stack etch) should also be below the bonding interface to clear off the well junctions from the bonding interface on the side. In this case, p-well to p-well connections will go from epi-Si through the handle wafer. However, devices in the same n-well will be connected through underneath the STI with or without crossing bonding interface. It is preferred that the bonding interface can have good conductivity to ensure every pFET in the same n-well has good body contact. In case (100) Si 16 on top of (110) Si 12 (as shown in FIG. 9), the bonding interface is inside the p-well. The only requirement is that the spacer (and the stack etch) should be below the bonding interface to clear off the well pn junction on the side. In this scenario, p-well to p-well connection has to go across the bonding interface. Moreover to ensure good the body contact of every nFETs in the same p-well, good conductivity of the bonding interface is required.

Figure 10:
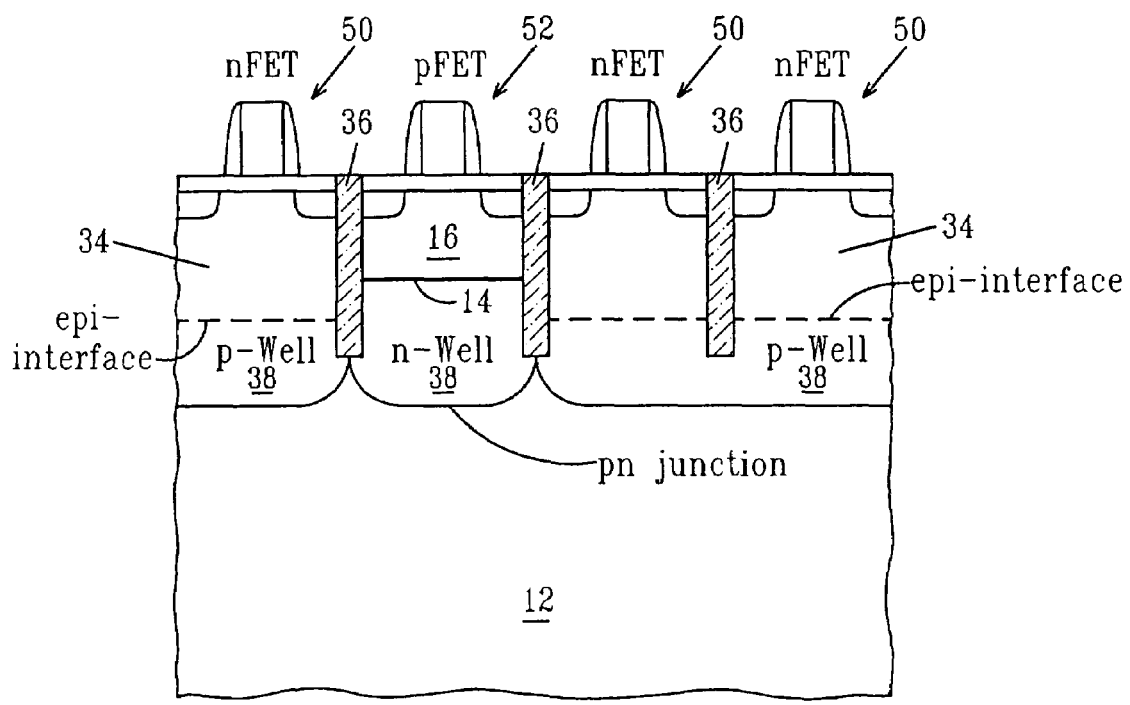
Figure 11:
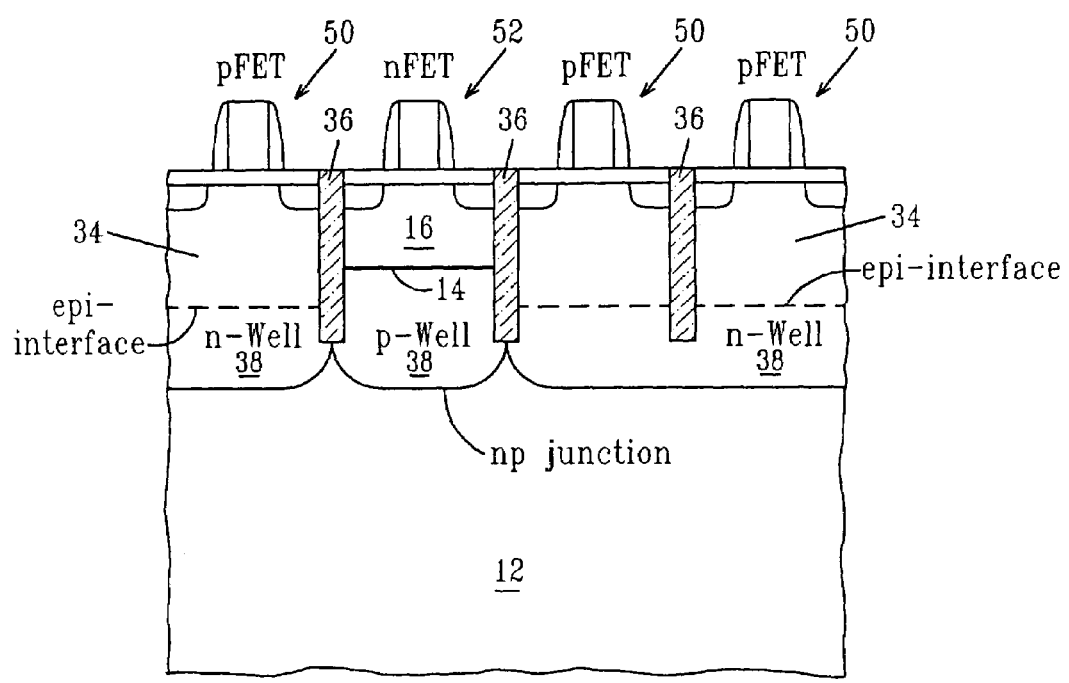

In FIGS. 10-11, there is shown how that the bonding interface can be designed above the STI. In case of (110) Si 16 on top of (100) handle 12 wafer (FIG. 10), both the bonding interface and well junction are below pFETs. To avoid S/D leakage, the bonding interface should be below the source/drain junction depletion depth. To avoid well-to-well leakage, the bonding interface should be also outside the well junction depletion region. Furthermore, the STI should be deep enough to clear off the well junction from the bonding interface on the side. To avoid floating body for the pFETs, the bonding interface is required to give good conductivity.

In case of (100) Si on (110) handle (as shown in FIG. 11), it is similar to the case in FIG. 10. To avoid S/D leakage, the bonding interface should be below the source/drain junction depletion depth. However, since the bonding interface is in p-well, to avoid well-well leakage, the STI depth is the only requirement for well isolation. To avoid floating body for the nFETs and have connections between p-well to p-well, the bonding interface is required to give good conductivity.

The above-described bulk-like CMOS on hybrid substrate can also be combined with strained Si process (See FIGS. 12-16). It is known that an nFET on (100) strained Si layer has higher performance than that on unstrained (100) Si substrate. Also it is known that a pFET on (110) strained Si layer has higher performance than that on unstrained (110) Si substrate. The strained Si layer is achieved by growing a relaxed SiGe buffer on either the top Si or the bottom Si.

The strained Si processes contemplated by the present invention will be described with reference to the specific embodiments shown in FIGS. 12-16. Unless otherwise specified, the processing steps and materials used above are used in the strained Si embodiments.

Figure 12D:
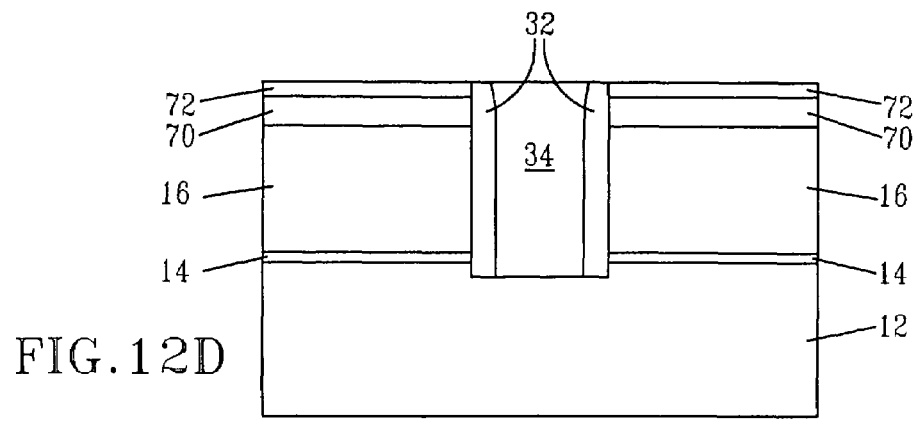
Figure 13A:
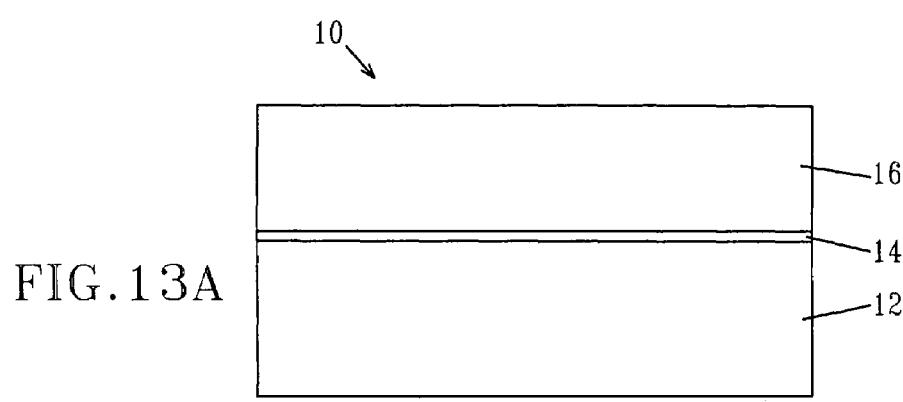
FIGS. 13A-13D are pictorial representations (through cross sectional views) showing another approach for providing a strained Si MOSFET of the present invention.
Figure 13B:
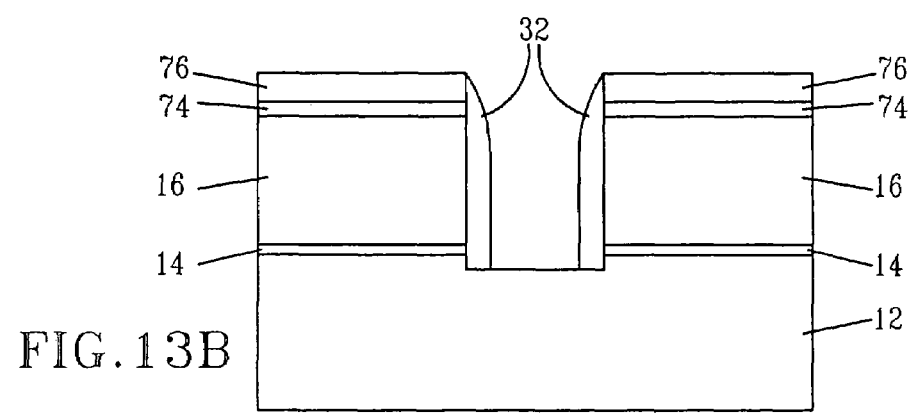
Figure 13C:
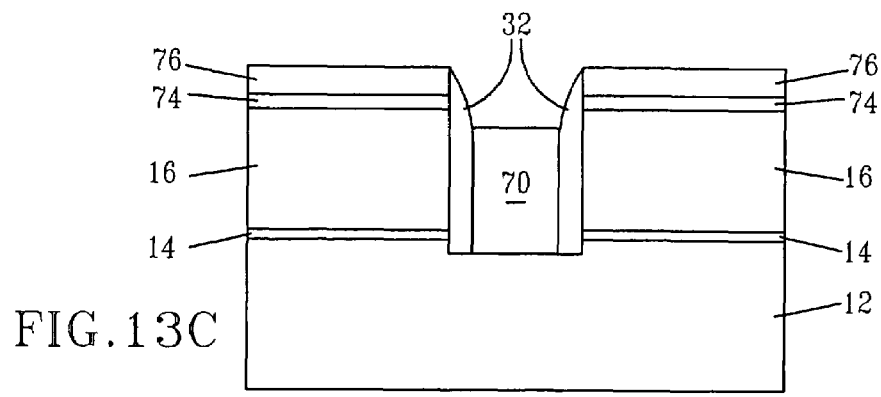
Figure 13D:
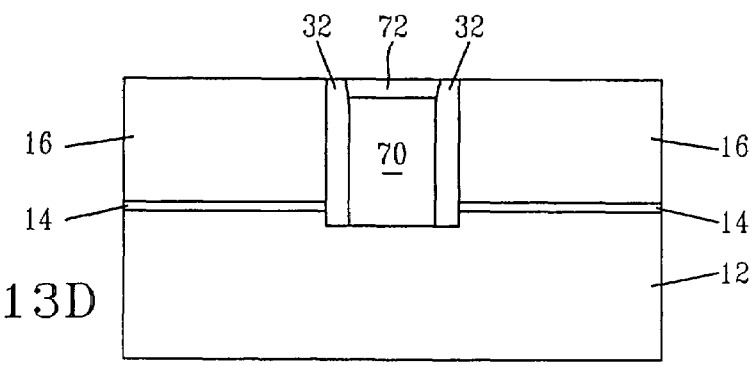

FIGS 12A-12D show an embodiment for providing strained Si MOSFET devices. In FIG. 12A, there is shown hybrid structure 10 that includes first semiconductor layer 12, interface 14, and second semiconductor layer 16 that is formed as described above.

Next, and as shown in FIG. 12B, a relaxed buffer layer 70 such as SiGe having the same crystallographic orientation as the second semiconductor layer 16 is formed by epitaxy. After formation of the relaxed buffer layer 70, a strained semiconductor layer 72, such as strained Si, is deposited on the relaxed buffer layer 70. In this embodiment of the present invention, the strained/relaxed layers have the same crystallographic orientation as the second semiconductor layer 16.

A masking layer (hereinafter referred to as a "pad stack") comprising a pad oxide 74 and a pad nitride 76 are then formed by deposition and the pad stack is subjected to lithography and etching so as to expose a portion of the second semiconductor layer 16. The exposed portion of the second semiconductor layer 16 is then etched stopping on, or within, the first semiconductor layer 12. Optional spacer 32 are then formed on each sidewall within the opening provided by the aforementioned etching step. The resultant structure is shown, for example, in FIG. 12C.

FIG. 12D shows the structure after semiconductor material 34 is regrown from the exposed surface of first semiconductor layer 12 and after planarization. The pad oxide 74 and nitride 76 may now be removed and CMOS devices as described above can be formed on the strained Si layer 72 and the regrown semiconductor material 34.

FIGS. 13A-13D show another embodiment that can be employed in the present invention. In this embodiment, the relaxed buffer layer 70 and strained semiconductor 72 are formed in the opening on the exposed surface of the first semiconductor layer 12. In this instance, the relaxed buffer layer/strained semiconductor stack has the same crystallographic orientation as the first semiconductor layer 12. The processing steps used in this embodiment are similar to those described above in connection with FIGS. 12A-12D except for the location of the relaxed buffer layer and the strained semiconductor layer.

Figure 14A:
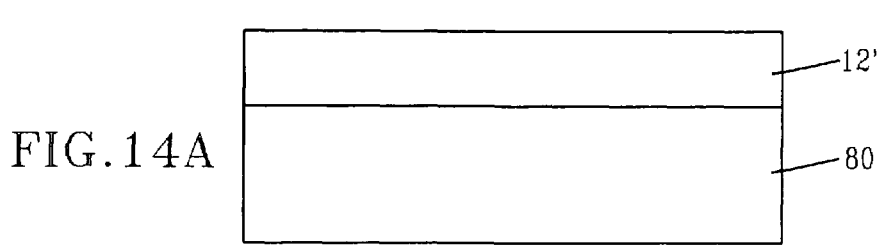
FIGS. 14A-14D are pictorial representations (through cross sectional views) showing still another approach for providing a strained Si MOSFET of the present invention.
Figure 14B:
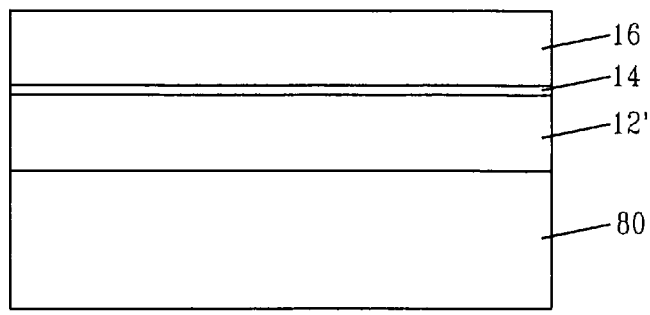

FIGS. 14A-14D shows another embodiment of the present invention. In this embodiment, a semiconductor wafer, as shown in FIG. 14A, is employed as one of the wafers for direct bonding. In particular, the wafer shown in FIG. 14A includes a relaxed semiconductor layer 12', such as SiGe, that is formed on a handling wafer 80. Relaxed semiconductor layer 12' has the same characteristics as first semiconductor layer 12 described above. Next, a second semiconductor layer 16 having a different crystal orientation than the relaxed semiconductor layer 12' is bonded to the wafer shown in FIG. 14A using the direct bonding technique mentioned above to provide the structure shown in FIG. 14B.

Figure 14C:
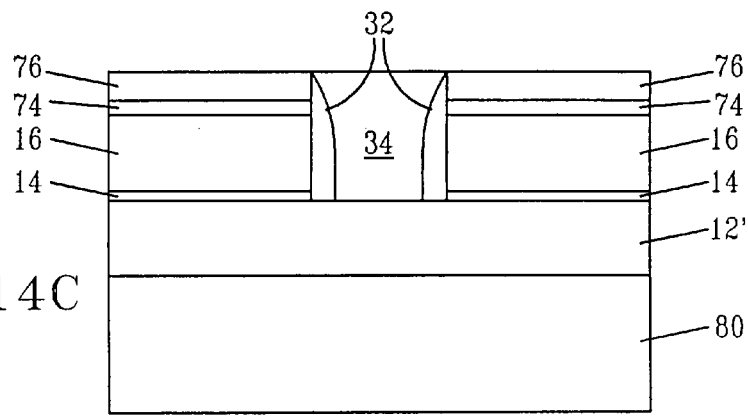
Figure 14D:
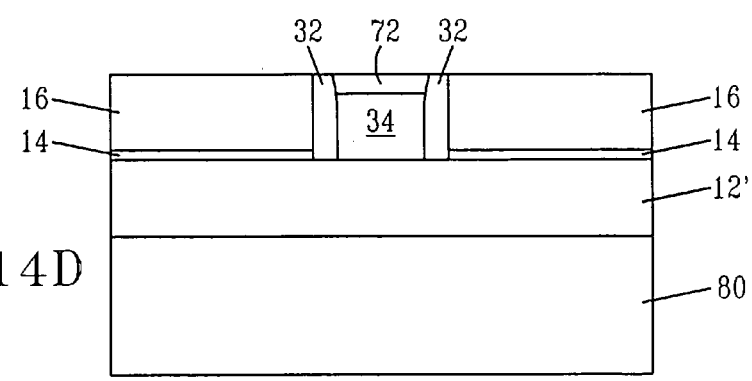
Figure 15A:
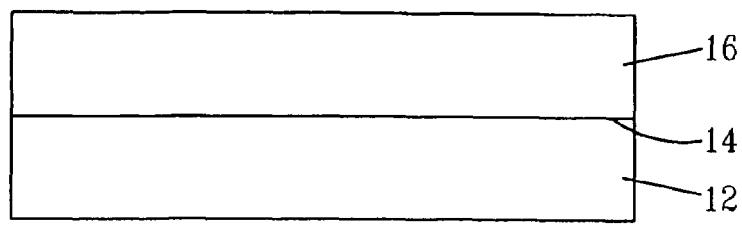
FIGS. 15A-15D are pictorial representations (through cross sectional views) showing a further approach for providing strained Si nFET and pFET.
Figure 15B:
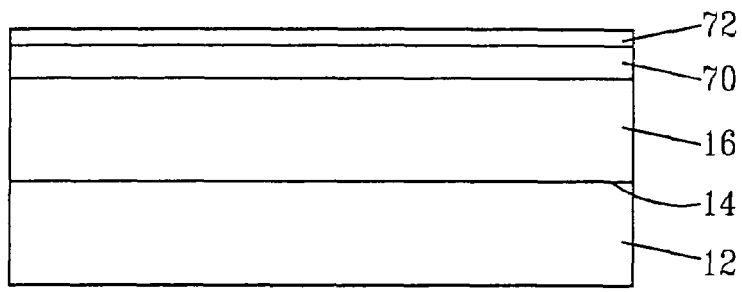
Figure 15C:
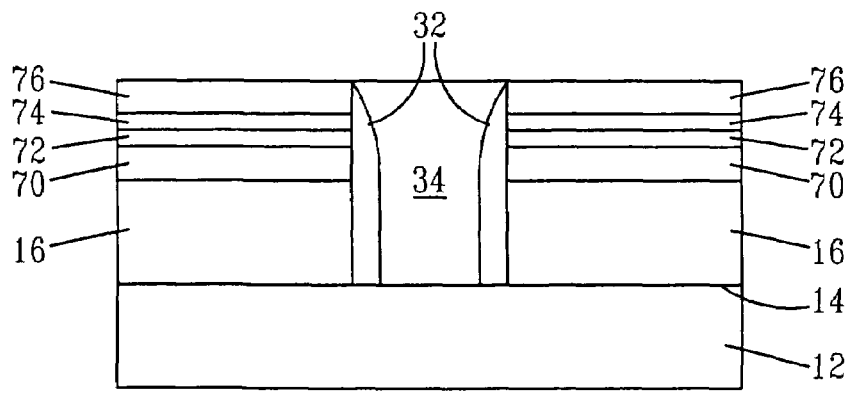
Figure 15D:
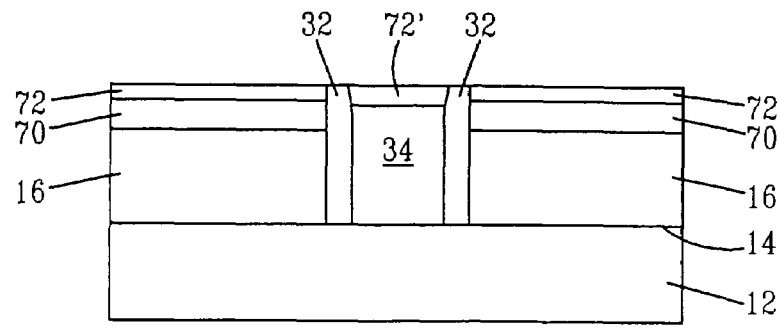

A patterned pad stack comprising pad oxide 74 and pad nitride 76 is then formed as described above, an opening is provided that exposes a portion of the relaxed buffer layer 12', optional spacers 32 are formed and then a semiconductor material 34 is grown and planarized providing the structure shown in FIG. 14C.

The semiconductor material 34 is then recessed using a timed etching process. Strained semiconductor layer 72 is then formed on the recessed semiconductor material 34 and thereafter the pad stack is removed providing the structure shown in FIG. 14D. CMOS devices, as described above, are then formed on the second semiconductor layer 16 and the strained Si layer 72. Note that the strained Si layer 72 has the same crystallographic orientation as the relaxed buffer layer 12' which is different from the second semiconductor layer 16.

FIGS. 15A-15D show a further embodiment of the present invention. In this embodiment, a first semiconductor layer 12 is directly bonded to a second semiconductor layer 16. A relaxed semiconductor 70 and a strained semiconductor layer 72 are then formed (as described above) on the second semiconductor layer 16 providing the structure shown in FIG. 15B.

A pad stack comprising pad oxide 74 and pad nitride 76 are then formed on the strained semiconductor layer and thereafter patterned. An opening extending down to the first semiconductor layer 12 is provided and then optional spacers 32 are formed in the opening. After optional spacer 32 formation, a semiconductor material 34 comprising a relaxed SiGe layer is formed and planarized providing the structure shown, for example in FIG. 15C. A portion of the relaxed SiGe layer 34 is recessed utilizing a time reactive ion etch process and thereafter strained semiconductor layer 72' is provided and the pad stack is removed from the structure providing the structure shown in FIG. 15D. In this case, the strained semiconductor layer 72 has a different crystallographic orientation as compared to strained semiconductor layer 72'. CMOS device can be formed on each of the strained semiconductor layers as described above.

Figure 16A:
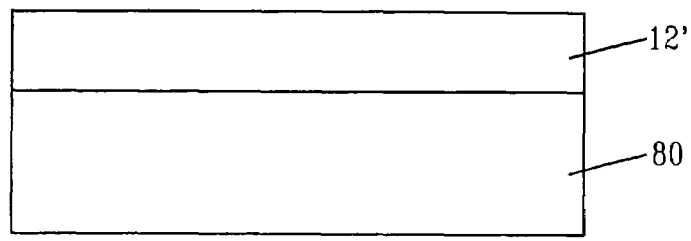
FIGS. 16A-16D are pictorial representations (through cross sectional views) showing a still further approach for providing strained Si nFET and pFET.
Figure 16B:
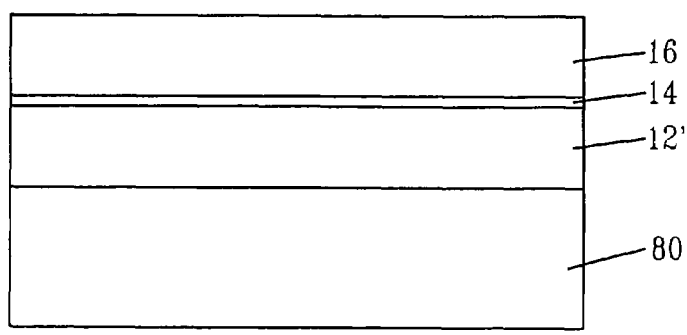
Figure 16C:
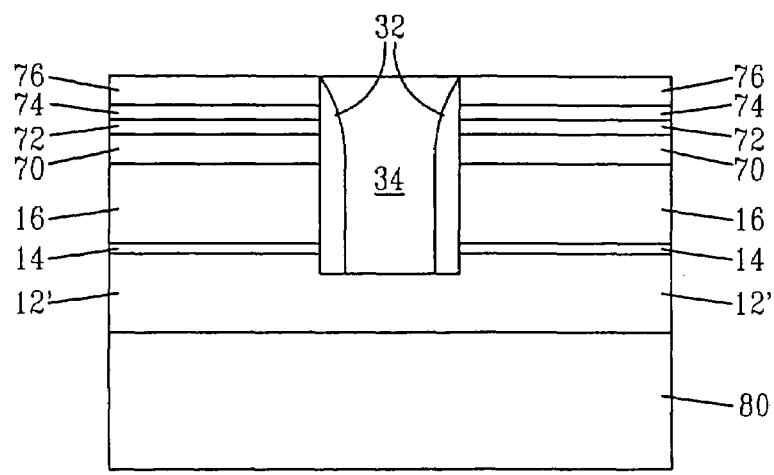
Figure 16D:
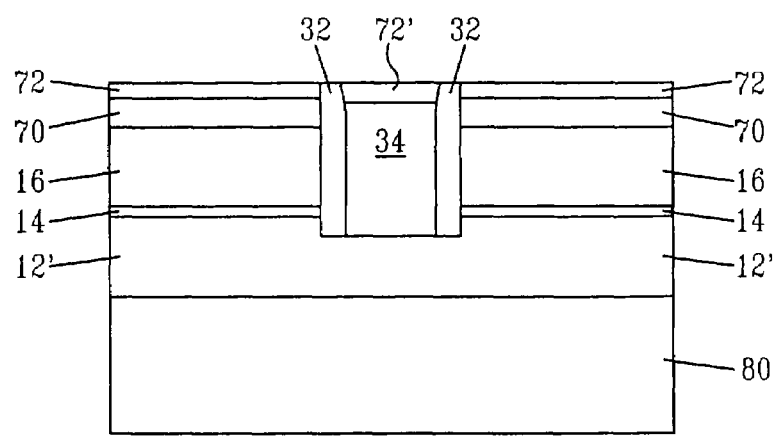

FIGS. 16A-16B show a still further embodiment of the present invention. In this embodiment, a relaxed semiconductor layer 12' is formed on a handling wafer 80 (See, FIG. 16A) and then that semiconductor layer is directly bonded to a second semiconductor layer 16. A relaxed buffer layer 70 and a strained semiconductor layer 72 having the same crystallographic orientation as that of the second semiconductor layer 16 is then formed and a pad stack comprising pad oxide 74 and pad nitride 74 is provided. After lithography and etching which exposes a surface portion of the relaxed semiconductor layer 12', optional spacers 32 are formed and a relaxed semiconductor layer 34 is epitaxial grown on the relaxed semiconductor layer 12' and then the structure is planarized. FIG. 16C shows the resultant structure.

The regrown relaxed semiconductor layer 34 is recessed as described above and a stained Si layer 72' is formed on the recessed surface. The structure is then planarized providing the structure shown in FIG. 16D. CMOS devices are then formed, as described above, on strained semiconductor layer 72 and strained semiconductor layer 72'. In accordance with the present invention, each of the strained semiconductor layers has different crystallographic orientation.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a hybrid substrate comprising:
   providing a first semiconductor wafer comprising a first semiconductor material having a first crystallographic orientation and a second semiconductor wafer comprising a second semiconductor material having a second crystallographic orientation which is different from the first crystallographic orientation; and
   bonding the first semiconductor wafer to the second semiconductor wafer, wherein a conductive interface forms between the wafers.

2. The method of claim 1 further comprising treating a surface of at least one of the wafers to provide a hydrophobic or hydrophilic surface for bonding.

3. The method of claim 2 wherein said treating comprises a HF dip process.

4. The method of claim 2 wherein said treating comprises a dry clean process, an argon high-energy surface etch, a wet chemical oxidizing acid or any combination thereof.

5. The method of claim 1 wherein said bonding comprising contacting the two wafers at nominal room temperature.

6. The method of claim 5 further comprising applying an external force during said contacting.

7. The method of claim 1 further comprising an annealing step following said bonding.

8. The method of claim 7 wherein said annealing is performed at a temperature from about 900° to about 1300° C.

9. The method of claim 7 wherein said annealing is performed in $O_2$, $N_2$, Ar or a low vacuum.

10. The method of claim 7 wherein said annealing is performed at a temperature of less than 900° C.

11. The method of claim 1 wherein said second semiconductor wafer is obtained by a layer transfer technique.

12. The method of claim 1 wherein said second semiconductor wafer comprises an implant region and following said bonding a heating step and a layer splitting anneal are performed.

13. The method of claim 1 wherein said first semiconductor wafer has a (100) crystal orientation and said second semiconductor wafer has a (110) crystal orientation.

14. The method of claim 1 wherein said first semiconductor wafer has a (110) crystal orientation and said second semiconductor wafer has a (100) crystal orientation.

15. A method of forming an integrated semiconductor structure comprising:
   providing a hybrid substrate comprising at least a first semiconductor layer of a first crystallographic orientation and a second semiconductor layer of a second crystallographic orientation separated by a conducting interface, said first crystallographic orientation is different from said second crystallographic orientation and said first semiconductor layer lies below said second semiconductor layer;
   selectively etching a portion of the hybrid substrate to expose a surface of the first semiconductor layer;
   regrowing a semiconductor material on said exposed surface of the first semiconductor layer, said semiconductor material having a crystallographic orientation that is the same as the first crystallographic orientation;
   providing well regions in said second semiconductor layer and said regrown semiconductor material; and
   forming at least one first semiconductor device on said regrown semiconductor material, while forming at least one second semiconductor device on said second semiconductor layer.

16. The method of claim 15 wherein said providing a hybrid substrate comprises providing a first semiconductor wafer comprising a first semiconductor material having a first crystallographic orientation and a second semiconductor wafer comprising a second semiconductor material having a second crystallographic orientation which is different from the first crystallographic orientation; and bonding the first semiconductor wafer to the second semiconductor wafer, wherein a conductive interface forms between the wafers.

17. The method of claim 16 further comprising treating a surface of at least one of the wafers to provide a hydrophobic or hydrophilic surface for bonding.

18. The method of claim 17 wherein said treating comprises a HF dip process.

19. The method of claim 17 wherein said treating comprises a dry clean process, an argon high-energy surface etch, a wet chemical oxidizing acid or any combination thereof.

20. The method of claim 16 wherein said bonding comprising contacting the two wafers at nominal room temperature.

21. The method of claim 20 further comprising applying an external force during said contacting.

22. The method of claim 16 further comprising an annealing step following said bonding.

23. The method of claim 22 wherein said annealing is performed at a temperature from about 900° to about 1300° C.

24. The method of claim 22 wherein said annealing is performed in $O_2$, $N_2$, Ar or a low vacuum.

25. The method of claim 22 wherein said annealing is performed at a temperature of less than 900° C.

26. The method of claim 16 wherein said second semiconductor wafer is obtained by a layer transfer technique.

27. The method of claim 16 wherein said second semiconductor wafer comprises an implant region and following said bonding a heating step and a layer splitting anneal are performed.

28. The method of claim 15 wherein said selectively etching comprising lithography and etching.

29. The method of claim 15 wherein said regrowing comprising epitaxial growing.

30. The method of claim 15 wherein said regrown semiconductor material is recessed and another semiconductor material is formed atop the recessed surface, said regrown semiconductor material and said another material both having the first crystallographic orientation.

31. The method of claim 15 wherein said providing well regions comprises patterning, ion implantation and annealing.

32. The method of claim 15 wherein the first crystallographic orientation is (110) and the second crystallographic orientation is (100).

33. The method of claim 32 wherein said at least one first semiconductor device is a pFET and the at least one second semiconductor device is an nET.

34. The method of claim 15 wherein the first crystallographic orientation is (100) and the second crystallographic orientation is (110).

35. The method of claim 34 wherein said at least one first semiconductor device is an nFET and the at least one second semiconductor device is a pFET.

36. The method of claim 15 wherein at least one of said first semiconductor device or said second semiconductor device is formed on a strained semiconductor material.

37. The method of claim 36 wherein said strained semiconductor material is formed atop a relaxed semiconductor material.

* * * * *